(12) United States Patent
Cheng et al.

(10) Patent No.: US 8,916,933 B2
(45) Date of Patent: Dec. 23, 2014

(54) SEMICONDUCTOR DEVICES HAVING TENSILE AND/OR COMPRESSIVE STRAIN AND METHODS OF MANUFACTURING AND DESIGN STRUCTURE

(75) Inventors: Kangguo Cheng, Guilderland, NY (US); Carl J. Radens, LaGrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/491,036

(22) Filed: Jun. 7, 2012

(65) Prior Publication Data

US 2012/0241765 A1    Sep. 27, 2012

Related U.S. Application Data

(62) Division of application No. 12/984,927, filed on Jan. 5, 2011, which is a division of application No. 12/054,699, filed on Mar. 25, 2008, now Pat. No. 7,892,932.

(51) Int. Cl.
| | | |
|---|---|---|
| *H01L 21/70* | (2006.01) | |
| *H01L 29/66* | (2006.01) | |
| *H01L 29/78* | (2006.01) | |
| *H01L 21/8238* | (2006.01) | |
| *H01L 29/165* | (2006.01) | |

(52) U.S. Cl.
CPC .. *H01L 21/823807* (2013.01); *H01L 29/66636* (2013.01); *H01L 29/7848* (2013.01); *H01L 29/66628* (2013.01); *H01L 29/165* (2013.01); *H01L 21/823814* (2013.01)
USPC ............... 257/350; 257/369; 257/E27.062

(58) Field of Classification Search
USPC ........... 257/350, 338, 351, 369, E27.062, 257/E27.06
See application file for complete search history.

(56) References Cited

U.S. PATENT DOCUMENTS

| | | | |
|---|---|---|---|
| 6,838,695 B2 | 1/2005 | Doris et al. | |
| 7,303,949 B2* | 12/2007 | Chen et al. | 438/199 |
| 2004/0173815 A1 | 9/2004 | Yeo et al. | |
| 2005/0035470 A1 | 2/2005 | Ko et al. | |
| 2005/0082616 A1 | 4/2005 | Chen et al. | |
| 2005/0148133 A1 | 7/2005 | Chen et al. | |
| 2006/0086987 A1* | 4/2006 | Chen et al. | 257/369 |
| 2007/0045729 A1* | 3/2007 | Hoentschel et al. | 257/344 |

(Continued)

FOREIGN PATENT DOCUMENTS

| | | |
|---|---|---|
| JP | 2002024310 | 1/2002 |
| JP | 2009-026795 | 2/2005 |

(Continued)

OTHER PUBLICATIONS

International Search Report dated May 12, 2009.
Office Action for related U.S. Appl. No. 12/984,927 dated Dec. 7, 2012, 6 pages.

(Continued)

*Primary Examiner* — Thanhha Pham
(74) *Attorney, Agent, or Firm* — Steven Meyers; Roberts Mlotkowski Safran & Cole, P.C (57) ABSTRACT

A semiconductor device having a tensile and/or compressive strain applied thereto and methods of manufacturing the semiconductor devices and design structure to enhance channel strain. The gate structures for an NFET and a PFET have identically formed sidewalls, and stress materials are provided in recesses in source and drain regions of the NFET and the PFET.

20 Claims, 11 Drawing Sheets

(56) References Cited

U.S. PATENT DOCUMENTS

| | | |
|---|---|---|
| 2007/0057324 A1 | 3/2007 | Tews et al. |
| 2007/0122955 A1 | 5/2007 | Luo et al. |
| 2007/0196989 A1* | 8/2007 | Kim et al. ............ 438/300 |
| 2007/0232006 A1 | 10/2007 | Hellmich et al. |
| 2008/0006818 A1 | 1/2008 | Luo et al. |
| 2008/0006854 A1 | 1/2008 | Luo et al. |
| 2008/0040697 A1 | 2/2008 | Chidambarrao et al. |
| 2008/0157208 A1 | 7/2008 | Fischer et al. |
| 2008/0315316 A1 | 12/2008 | Jin |
| 2009/0166757 A1 | 7/2009 | Baiocco et al. |

FOREIGN PATENT DOCUMENTS

| | | |
|---|---|---|
| JP | 2007528593 | 10/2007 |
| JP | 2008004698 | 1/2008 |
| JP | 2008108929 | 5/2008 |
| JP | 2008198715 | 8/2008 |
| WO | WO2007014294 | 2/2007 |
| WO | WO2007015930 | 2/2007 |

OTHER PUBLICATIONS

Information Materials for IDS JPO Office Action Dated Mar. 5, 2013 Application No. 2011501942 Filed: Mar. 23, 2009.

* cited by examiner

FIG. 11

SEMICONDUCTOR DEVICES HAVING TENSILE AND/OR COMPRESSIVE STRAIN AND METHODS OF MANUFACTURING AND DESIGN STRUCTURE

CROSS REFERENCE TO RELATED APPLICATIONS

The present application is a divisional application of co-pending U.S. application Ser. No. 12/984,927, filed on Jan. 5, 2011, which is a divisional application of co-pending U.S. application Ser. No. 12/054,699, filed on Mar. 25, 2008, the contents of which are all incorporated by reference herein in their entirety.

FIELD OF THE INVENTION

The present invention generally relates to semiconductor devices and methods of manufacturing the same, and more specifically, to semiconductor devices having a tensile and/or compressive strain applied thereto and methods of manufacturing the semiconductor devices and a design structure to enhance channel strain.

BACKGROUND OF THE INVENTION

Mechanical strains within a semiconductor device substrate can modulate device performance by, for example, increasing the mobility of the carriers in the semiconductor device. That is, strains within a semiconductor device are known to enhance semiconductor device characteristics. Thus, to improve the characteristics of a semiconductor device, tensile and/or compressive strains are created in the channel of the n-type devices (e.g., NFETs) and/or p-type devices (e.g., PFETs), respectively. However, the same strain component, for example tensile strain or compressive strain, improves the device characteristics of one type of device (i.e., n-type device or p-type device) while discriminatively affecting the characteristics of the other type device.

Accordingly, in order to maximize the performance of both NFETs and PFETs within integrated circuit (IC) devices, the strain components should be engineered and applied differently for NFETs and PFETs. That is, because the type of strain which is beneficial for the performance of an NFET is generally disadvantageous for the performance of the PFET. More particularly, when a device is in tension (in the direction of current flow in a planar device), the performance characteristics of the NFET are enhanced while the performance characteristics of the PFET are diminished.

To increase the strain levels in a device, a SiGe layer has been used in combination with a silicon layer. When epitaxially grown on silicon, an unrelaxed SiGe layer will have a lattice constant that conforms to that of the silicon substrate. Upon relaxation (through a high temperature process for example), the SiGe lattice constant approaches that of its intrinsic lattice constant which is larger than that of silicon. Accordingly, when a silicon layer is epitaxially grown on the SiGe, the silicon layer conforms to the larger lattice constant of the relaxed SiGe layer that results in a physical biaxial strain (e.g., expansion) to the silicon layer. This physical strain applied to the silicon layer is beneficial to the devices. While methods using SiGe provide improved device performance, additional and complex processing is required to form the gate structures, liners, spacers, etc. thus resulting in higher cost.

Alternatively, to selectively create tensile strain in an NFET and compressive strain in a PFET, distinctive processes and different combinations of materials can be used such as, for example, liners on gate sidewalls. The liners selectively induce the appropriate strain in the channels of the FET devices. While this provides tensile strain to the NFET device and compressive strain along the longitudinal direction of the PFET device, they still require additional materials and/or more complex processing, and thus, result in higher cost. For example, additional processing steps are needed to form the gate structures for both the NFET and PFET type devices.

Thus, it is desired to provide more cost-effective and simplified methods for creating tensile and compressive strains in the channels of the NFETs and PFETs, respectively. Accordingly, there exists a need in the art to overcome the deficiencies and limitations described hereinabove.

SUMMARY OF THE INVENTION

In a first aspect of the invention, a method of forming a semiconductor structure comprises forming a gate structure for an NFET and a PFET. The method further comprises forming sidewalls on the gate structure for the NFET and the PFET using a same deposition and etching process. The method also comprises providing stress materials in the source and drain regions of the NFET and the PFET.

In embodiments, recesses are formed in the source and drain regions of the NFET and the PFE in a single masking process. The stress materials are grown in the recesses. The recesses are formed by an etching process. Additional etching of the recesses of the NFET is performed in order to make the recesses of the NFET deeper than the recesses of the PFET.

In further embodiments, the recesses are filled with a single type of stress material. The NFET or the PFET are blocked and the single type of stress material in an unblocked NFET or PFET is removed to reform recesses. The reformed recesses are filled with a different type of stress material. The single type of stress material is eSiGe, the different type of stress material is eSi:C, and the removing of the stress material is performed for the NFET.

In another embodiment, the single type of stress material is eSi:C, the different type of stress material is eSiGe and the removing the stress material is performed for the PFET. The reformed recesses are etched to a depth greater than the recesses. The stress materials are eSiGe for the PFET and eSi:C for the NFET. The stress materials are grown to a predetermined depth in the recesses.

In an additional aspect of the invention, a method of enhancing device performance comprises forming a gate structure for an NFET and a PFET and forming sidewalls on the gate structure for the NFET and the PFET using a same deposition and etching process. The method further comprises forming recesses in the source and drain regions of the NFET and the PFET, and filling the recesses for the source and drain regions of the NFET with a first type of stress material and the source and drain regions of the PFET with a second type of stress material.

In a further aspect of the invention, a method comprises: forming a gate structure for an NFET and a PFET by patterning a dielectric material, a gate material and a cap material; forming sidewalls on the gate structure for the NFET and the PFET using a same deposition and etching process; forming recesses in the source and drain regions of the NFET and the PFET; filling the recesses with a first type of stress material; protecting one of the NFET and the PFET; etching out the first type of stress material in the unblocked one of the NFET and the PFET to reform recesses; and filling in the reformed recesses with a second type of stress material, different than the first type of stress material.

In yet another aspect of the invention, a design structure embodied in a machine readable medium for designing, manufacturing, or testing an integrated circuit, the design structure comprises: forming a gate structure for an NFET and a PFET; forming sidewalls on the gate structure for the NFET and the PFET using a same deposition and etching process; and providing stress materials in the source and drain regions of the NFET and the PFET.

In a further aspect of the invention, structure comprises gate structures for an NFET and a PFET having identically formed sidewalls. Stress materials are formed in recesses in source and drain regions of the NFET and the PFET. In embodiments, the stress material for the NFET is eSi:C and the stress material for the PFET is eSiGe. The stress material for the NFET is at a depth greater than the stress material for the PFET.

BRIEF DESCRIPTION OF THE DRAWINGS

The present invention is described in the detailed description which follows, in reference to the noted plurality of drawings by way of non-limiting examples of exemplary embodiments of the present invention.

DETAILED DESCRIPTION OF THE INVENTION

The present invention generally relates to semiconductor devices and methods of manufacturing, and more specifically, to semiconductor devices having a tensile and/or compressive strain applied thereto and methods of manufacturing the semiconductor devices and a design structure to enhance channel strain. In embodiments, stress materials, i.e., eSi:C and eSiGe, in the source and drain regions of NFET and PFET devices, respectively, are provided to improve the channel strain. Also, in embodiments, spacers for the gates of both NFET and PFET devices are formed using same deposition and etching processes thus significantly reducing manufacturing costs by using less processing steps than conventional fabrication methods. By forming the spacers in the same fabrication steps, it is possible to form identical spacers for both an NFET and a PFET. Also, advantageously, the methods of the invention eliminate damage in the strained material and prevent strain relaxation due to exposure of eSi:C and eSiGe to an etching process.

Figure 1:
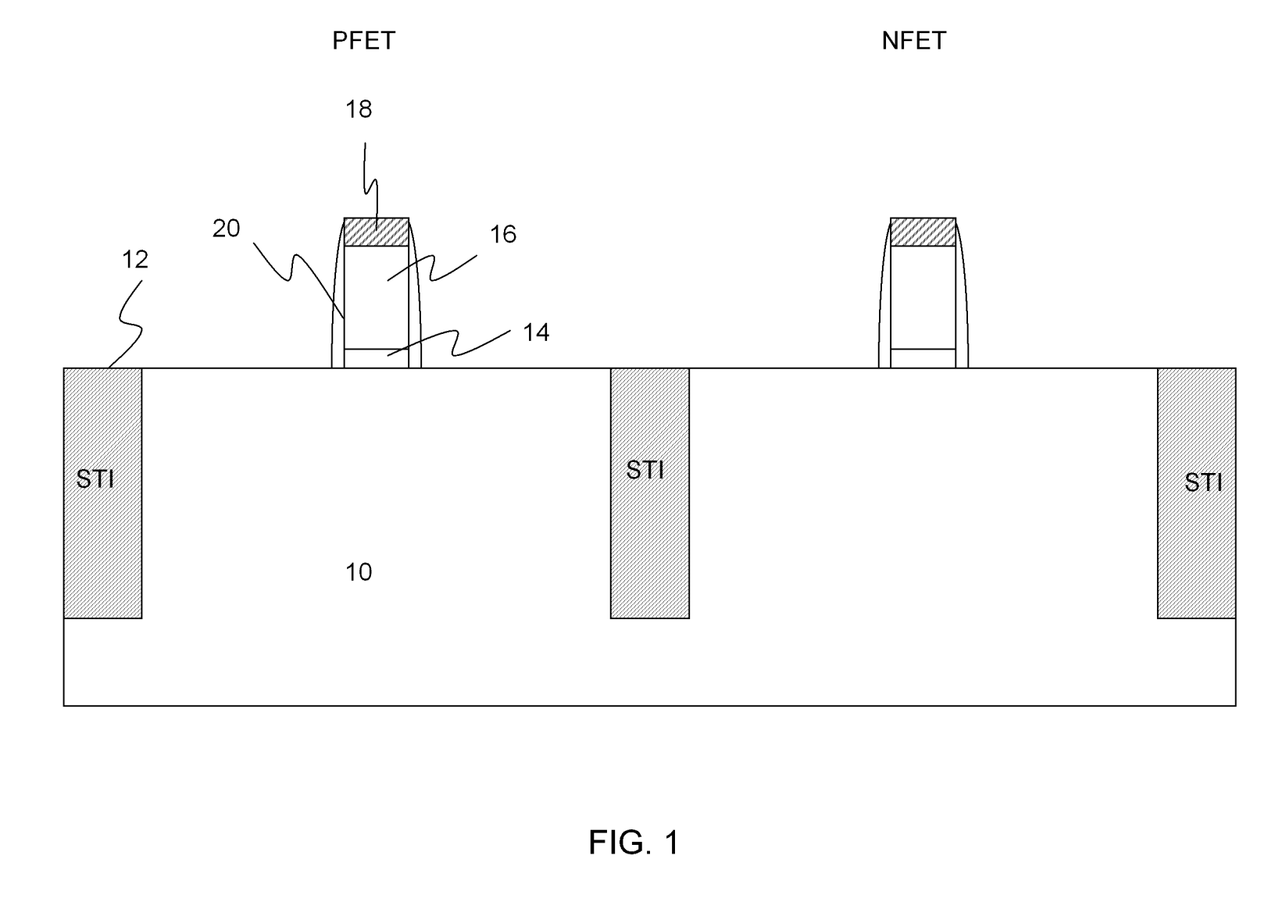
FIG. 1 shows a beginning structure in accordance with the invention.

FIG. 1 shows a conventional starting structure and respective processing steps for forming both an NFET and PFET in accordance with the invention. The starting structure includes, for example, shallow trench isolation (STI) structures 12 isolating areas of a wafer 10. The wafer 10 can be any conventional wafer material such as, for example, bulk Si, SOI or a hybrid of bulk Si and SOI. The STI structures 12 can be fabricated using any conventional type processes. For example, a lithography and subsequent etching process can be used to selectively provide trenches in the wafer 10. The trenches are then filled with oxide, for example, to form the STI structures 12.

A gate structure is Banned on the wafer 10, between STI structures 12. The gate structure is fabricated using conventional deposition, lithographic and etching processes. By way of one non-limiting illustration, a gate dielectric material 14 such as, for example, silicon oxide, silicon nitride, silicon oxynitride, high-k material, or any combination of these materials, is deposited on the wafer 10. Although not critical to the understanding of the invention, the gate dielectric material can range in thickness from about 10 Å to 200 Å. A gate material 16 is deposited on the gate dielectric material 14. The gate material 16 can be polysilicon, a metal (e.g., titanium), a metal alloy (e.g., titanium nitride, tantalum nitride, tungsten silicide, titanium silicide, cobalt silicide, nickel silicide), or any combination of those materials. A cap material 18 (e.g., nitride) is deposited on the gate material 16. In subsequent processes, the gate materials 14, 16, 18 are patterned using conventional processes, e.g., lithography and etching, to form the gate structures of the NFET and the PFET simultaneously.

Spacers 20 are formed on the side of the gate structure. In embodiments, the spacers 20 are nitride material and can be formed on both the NFET and PFET using the same deposition and etching processes. By forming the spacers in the same fabrication processes, it is possible to form identical spacers for both an NFET and a PFET. Alternatively, spacers 20 may comprise other materials, including but not limited to, oxide, oxynitride, carbide, or low-k materials. A combination of the materials is also contemplated by the present invention. By way of example, in embodiments, a nitride layer is deposited over the entire structure and then etched using a reactive ion etching (RIE). As should be understood by those of skill in the art, the RIE will etch the lateral surfaces of the nitride, with minimal etching on the vertical surfaces (surfaces on the vertical sides of the gate structure). In this way, nitride spacers 20 can be formed simultaneously on both the NFET and PFET using the same deposition and etching processes.

Figure 2:
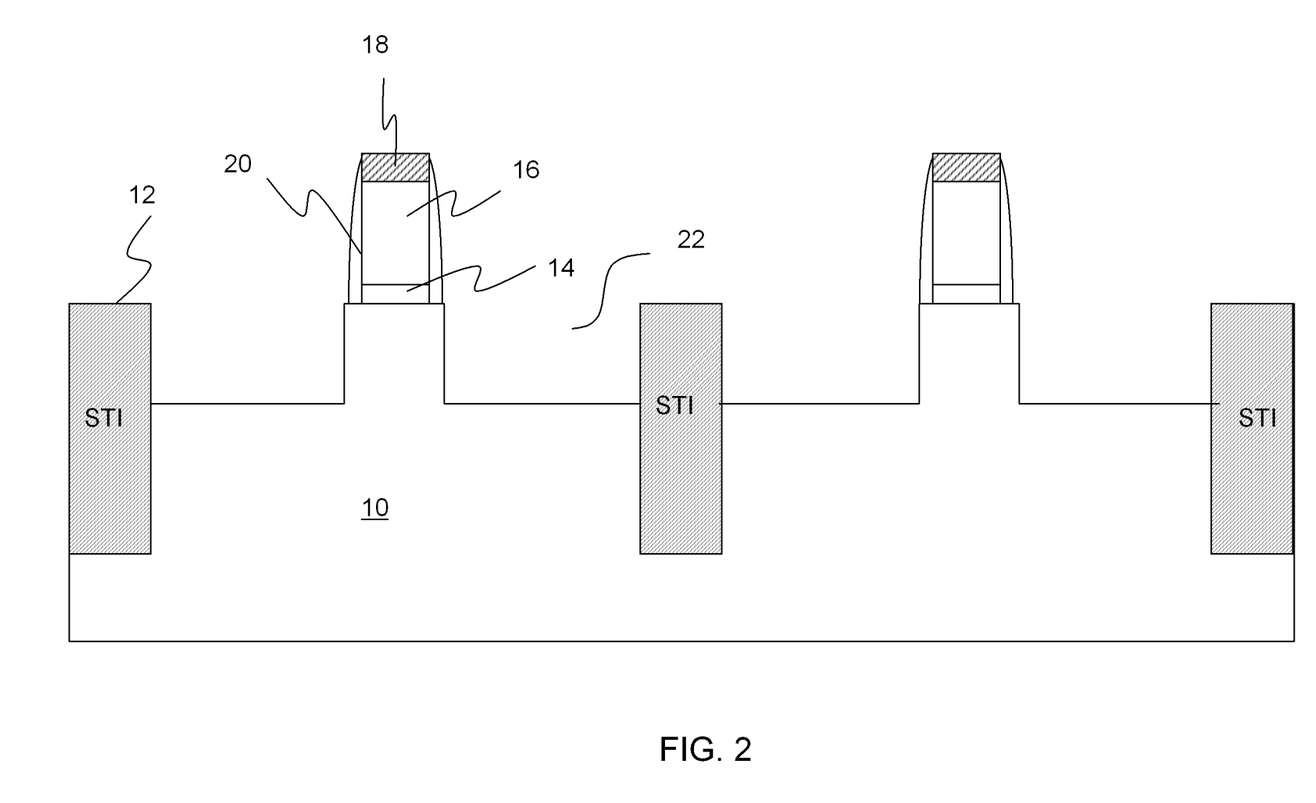
FIGS. 2-6 show intermediate structures and respective processing steps for forming a strained device in accordance with aspects of the invention.

FIG. 2 shows the formation of recesses 22 in the source and drain regions of both the PFET and the NFET. In embodiments, the recesses 22 can be formed using a conventional RIE, wet etch, or both. In embodiments, the RIE will be a selective etch, as should be understood by those of skill in the art. In embodiments, the recesses 22 can range in thickness depending on the particular application. For example, the recesses 22 can range in depth from about 100 Å to 1000 Å. In more preferred embodiments, the recesses can range in depth from about 300 Å to 500 Å. In any scenario, the depth of the recesses 22 can be adjusted to a specific depth to tune of the strain applied to the devices (NFET and PFET).

Figure 3:
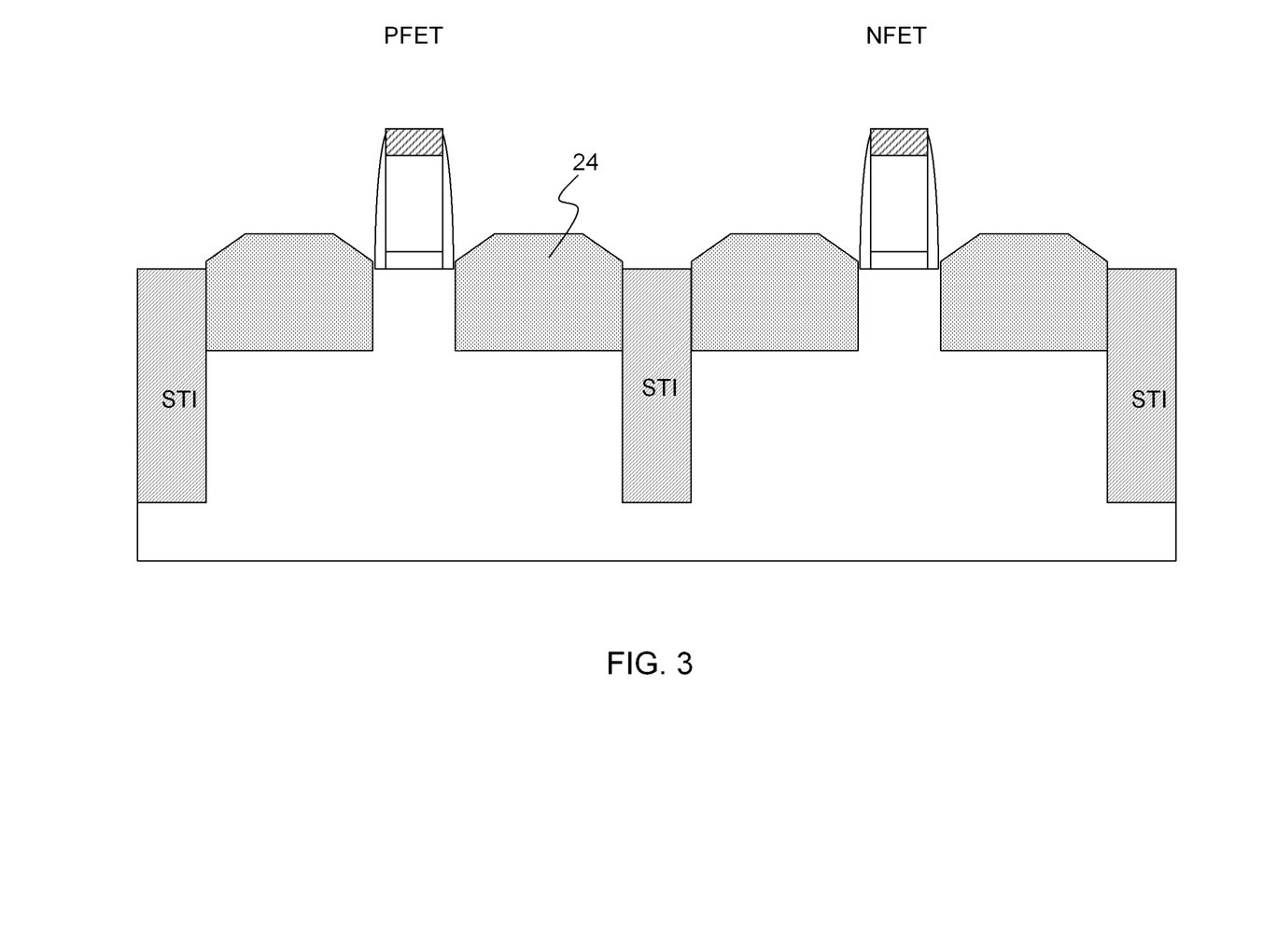

FIG. 3 shows further fabrication steps in accordance with the invention. In contemplated embodiments, the recesses 22 are filled with a stress material 24. In one embodiment, the stress material 24 is eSiGe formed by any suitable epitaxial growth method, for example, chemical vapor deposition (CVD) or molecular beam epitaxy (MBE). The concentration of germanium in the eSiGe can vary to tune the strain to PFET. For example, the atomic concentration of germanium in the eSiGe may range from about 1% to 50%, and about 20% to 40% is preferred. In another contemplated embodiment, the stress material 24 is eSi:C. The concentration of carbon in the eSi:C can vary to tune the strain to NFET. For example, the atomic concentration of carbon in the eSi:C may range from about 0.1% to 10%, and about 1% to 2% is preferred. It is preferred, though, that eSiGe is initially provided in the recesses 22 as it is more robust to subsequent annealing processes. Depending on the desired strain component, the stress material 24 can be grown to different heights, e.g., above the surface of the wafer 10, coplanar with the surface of the wafer 10 or below a surface of the wafer 10. For example, to increase a strain on the device the stress material 24 will be grown to above the surface of the wafer 10.

Figure 4:
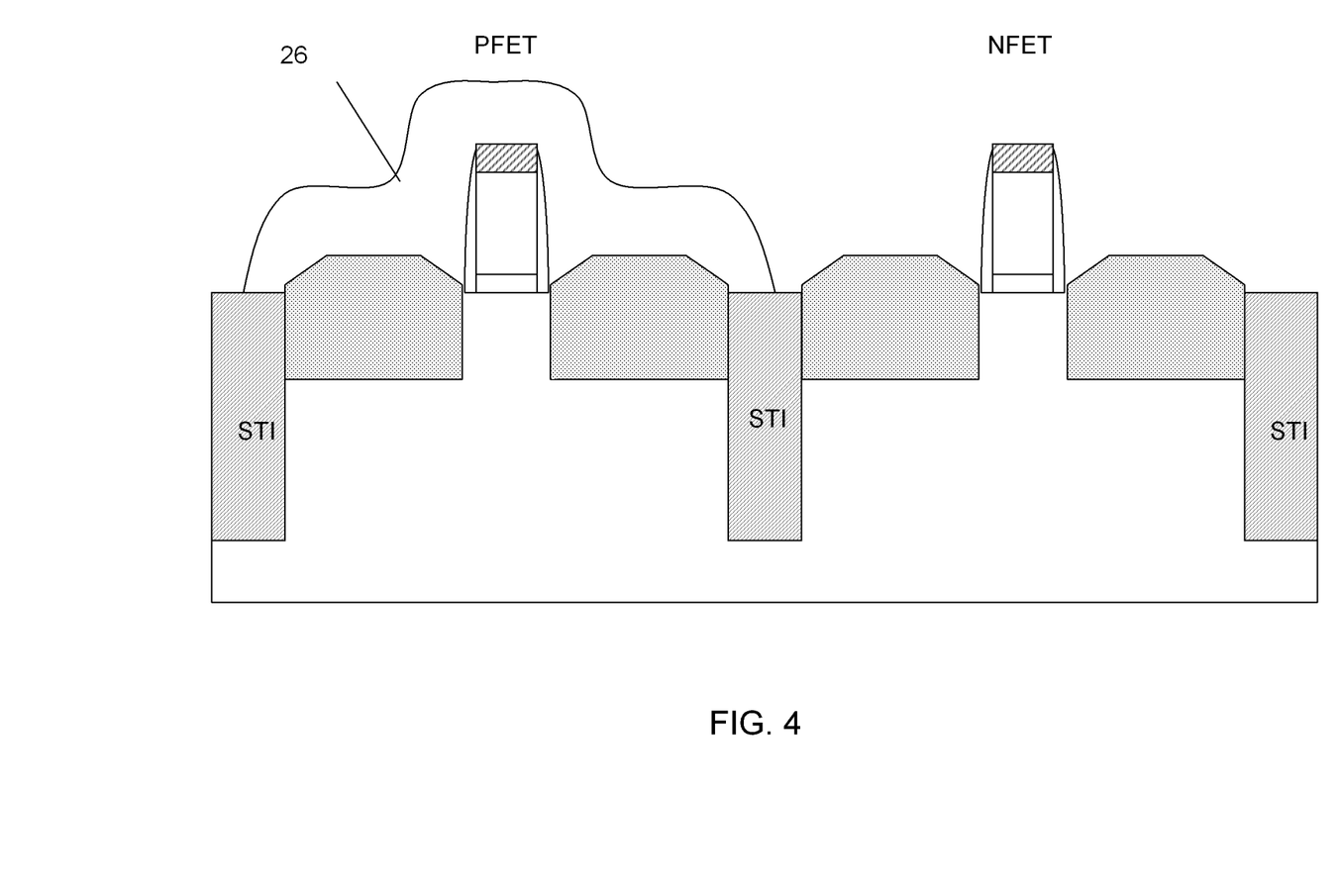

As shown in FIG. 4, a mask layer 26 (e.g., oxide) is formed over one of the devices by conventional deposition and patterning methods. In embodiments, the mask 26 is formed over the PFET when the recesses are filled with eSiGe. However, in alternate embodiments, the mask 26 can be formed over the NFET when the recesses are filled with eSi:C. In either scenario, the mask 26 will protect the stress material 24 within the recesses of the respective FET during subsequent etching steps.

Figure 5:
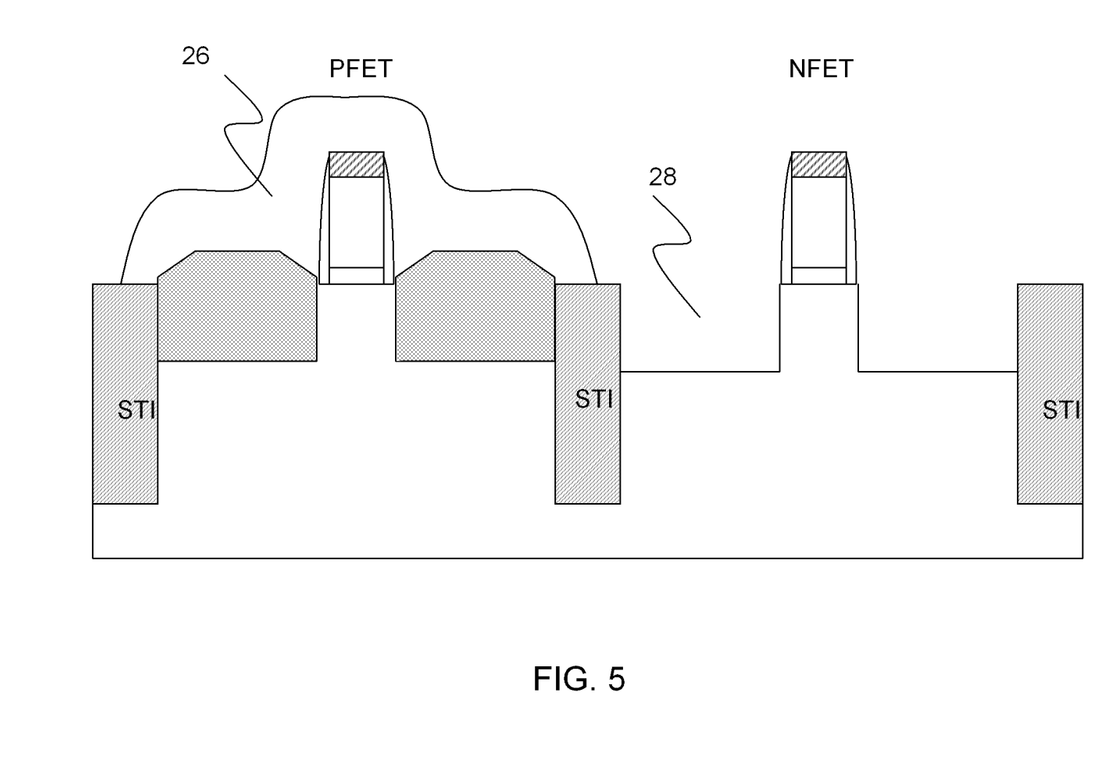

As shown in FIG. 5, the unprotected stress material is removed from the recesses. This forms recesses 28. In embodiments, the depth of the recesses 28 is the same as the depth of the original recesses 22; although other depths are also contemplated by the invention (See, FIG. 8). Although not shown, the recesses 28 can be formed in the source and drain regions of the PFET when the stress material is eSi:C.

Figure 6:
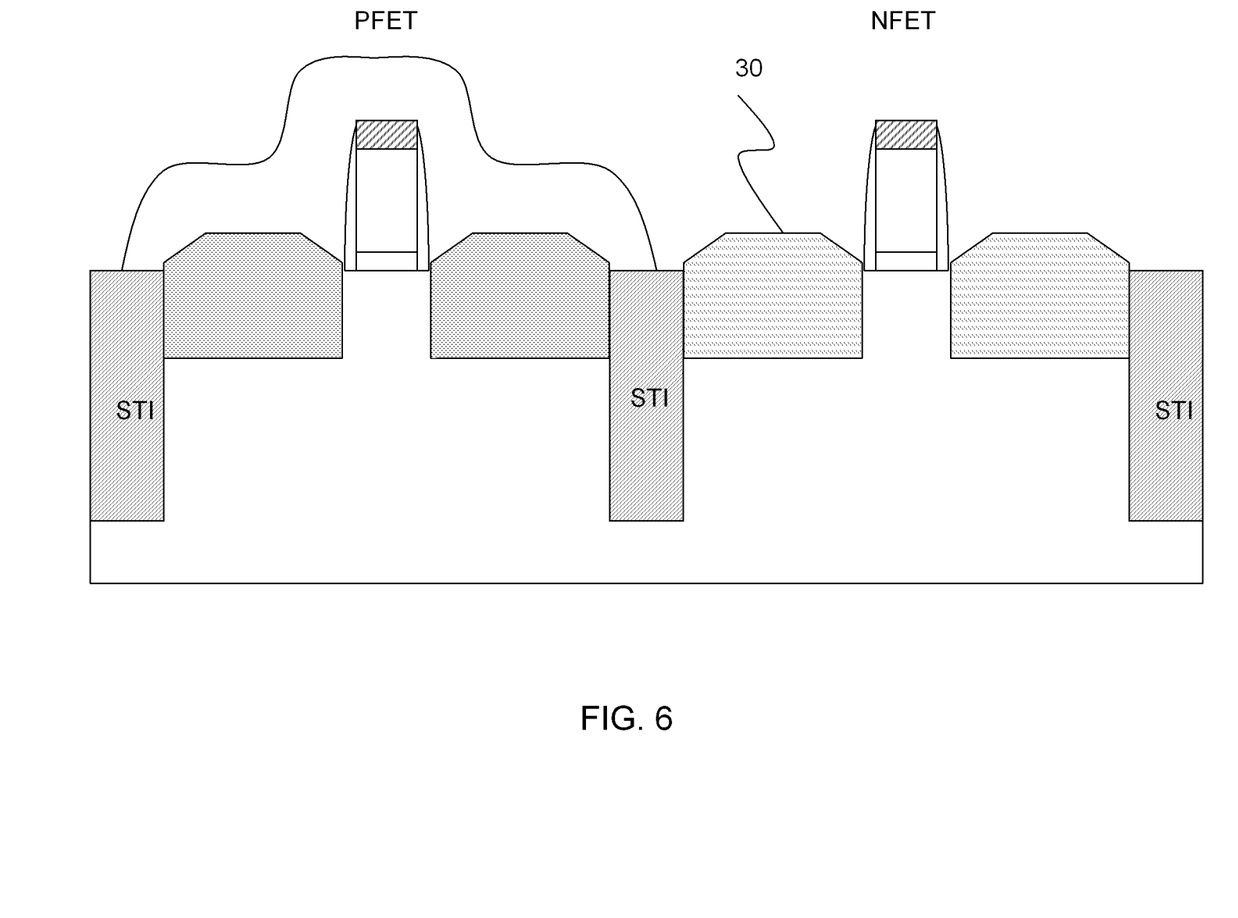

As shown in FIG. 6, the recesses 28 are filled with a second type of stress material 30. Again, depending the desired strain concentration, the stress material 30 can be grown to different heights, e.g., above the surface of the wafer 10, coplanar with the surface of the wafer 10 or below a surface of the wafer 10. For example, to increase a strain on the device, the stress material 24 will be grown to above the surface of the wafer 10. In the embodiment shown in FIG. 6, the stress material 30 is eSi:C formed by any suitable epitaxial growth method, for example, chemical vapor deposition (CVD) or molecular beam epitaxy (MBE). The concentration of carbon in the eSi:C can vary to tune the strain to NFET. For example, the atomic concentration of carbon in the eSi:C ranges from about 0.1% to 10%, and about 1% to 2% is preferred. In an alternate embodiment, when the stress material formed in the recess 22 is eSi:C, the stress material 30 will be eSiGe.

Figure 7:
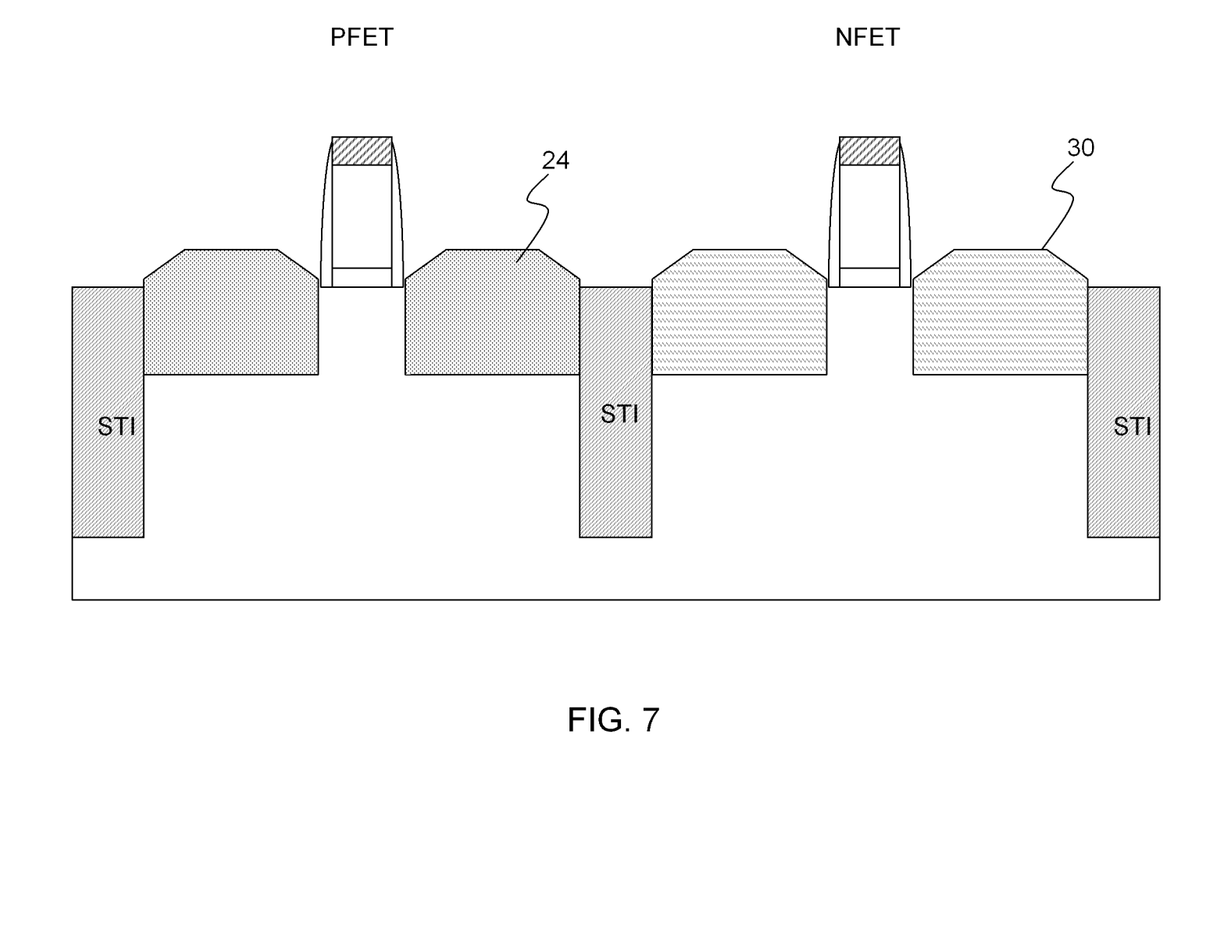
FIG. 7 shows a final structure and respective processing steps in accordance with an aspect of the invention.

As shown in FIG. 7, the mask is removed to form the final structure. In this embodiment, the PFET has a first type of stress material 24 (e.g., eSiGe) and the NFET has a second type of stress material 30 (e.g., eSi:C). Both of the stress materials 24, 30 have a bottom surface at the same or substantially the same depth.

Figure 8:
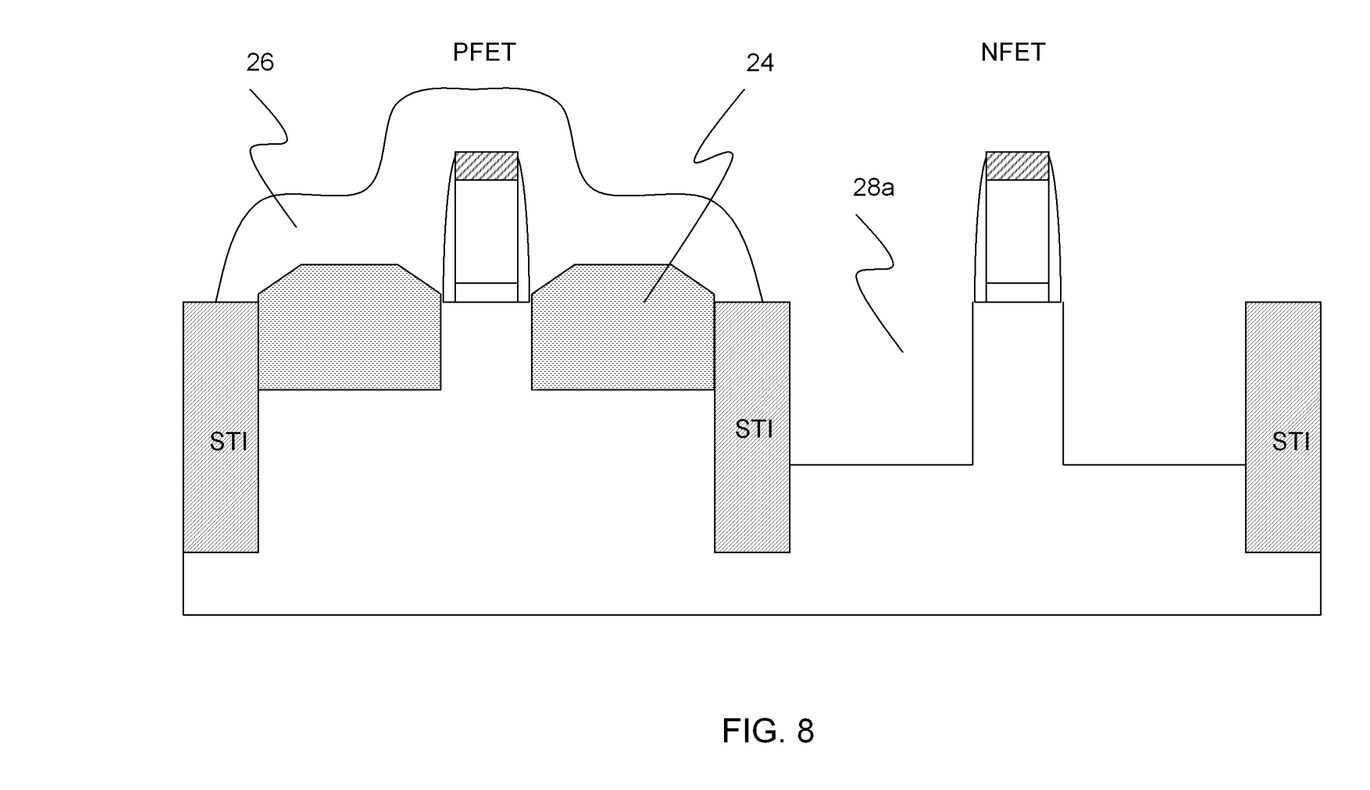
FIGS. 8 and 9 show intermediate structures and respective processing steps for forming an alternative strained device in accordance with different aspects of the invention.

FIG. 8 shows an alternative structure and processing step in accordance with an aspect of the invention. In this embodiment, after the same process step of FIG. 4 in the previous embodiment, the exposed wafer in the NFET region is further recessed after removing the eSiGe from the NFET region, resulting in deeper recesses 28a than in the previously described embodiment. The PFET region is covered by masking layer 26 during removing the eSiGe from NFET region. The recesses 28a can be formed in a single RIE process when removing the stress material or, alternatively, in separate etching steps.

Figure 9:
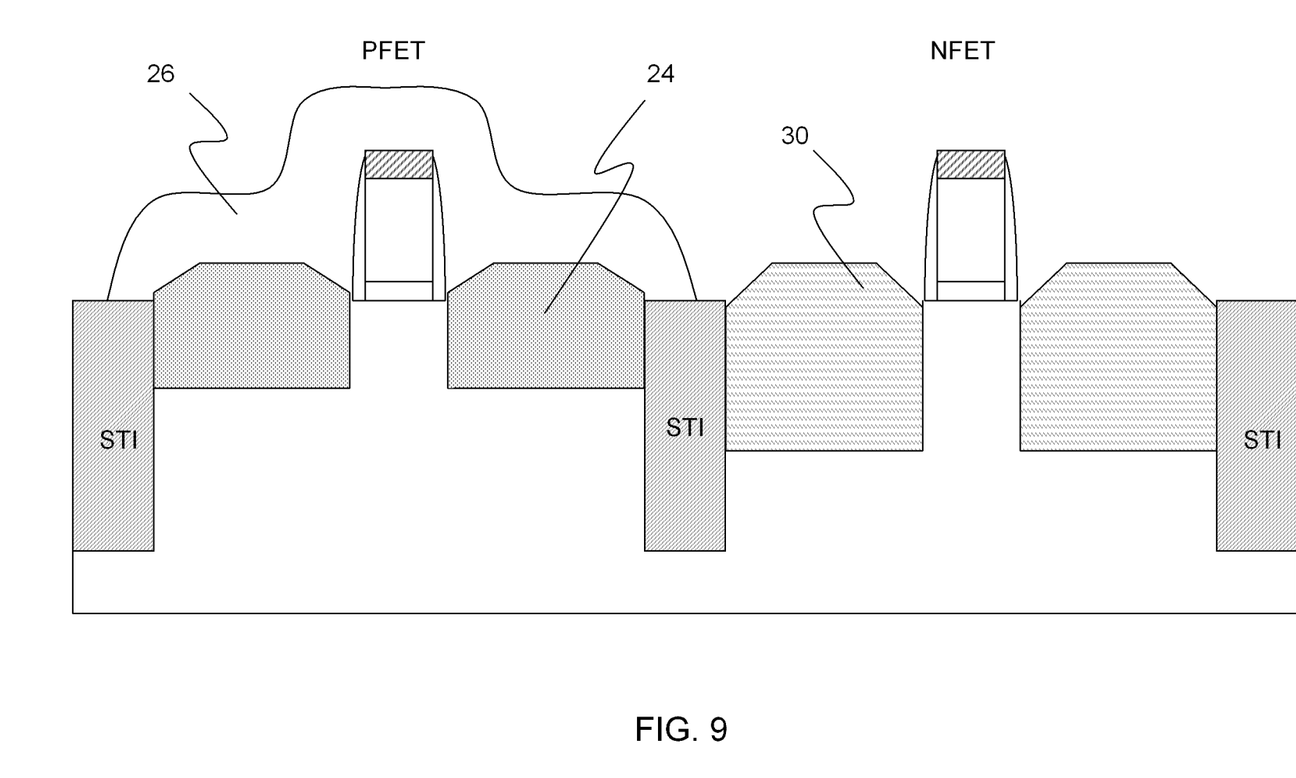

As shown in FIG. 9, the recesses 28a are filled with the stress material 30, e.g., eSi:C. More specifically, eSi:C is grown in the recesses 28a. Again, depending on the desired strain concentration, the stress material 30 can be grown to different heights, e.g., above the surface of the wafer 10, coplanar with the surface of the wafer 10 or below a surface of the wafer 10. For example, to increase a strain on the device, the stress material 24 will be grown to above the surface of the wafer 10. Also, as the recesses 28a are deeper than the recesses 22, the stress material 30 will be deeper than the stress material 24.

Figure 10:
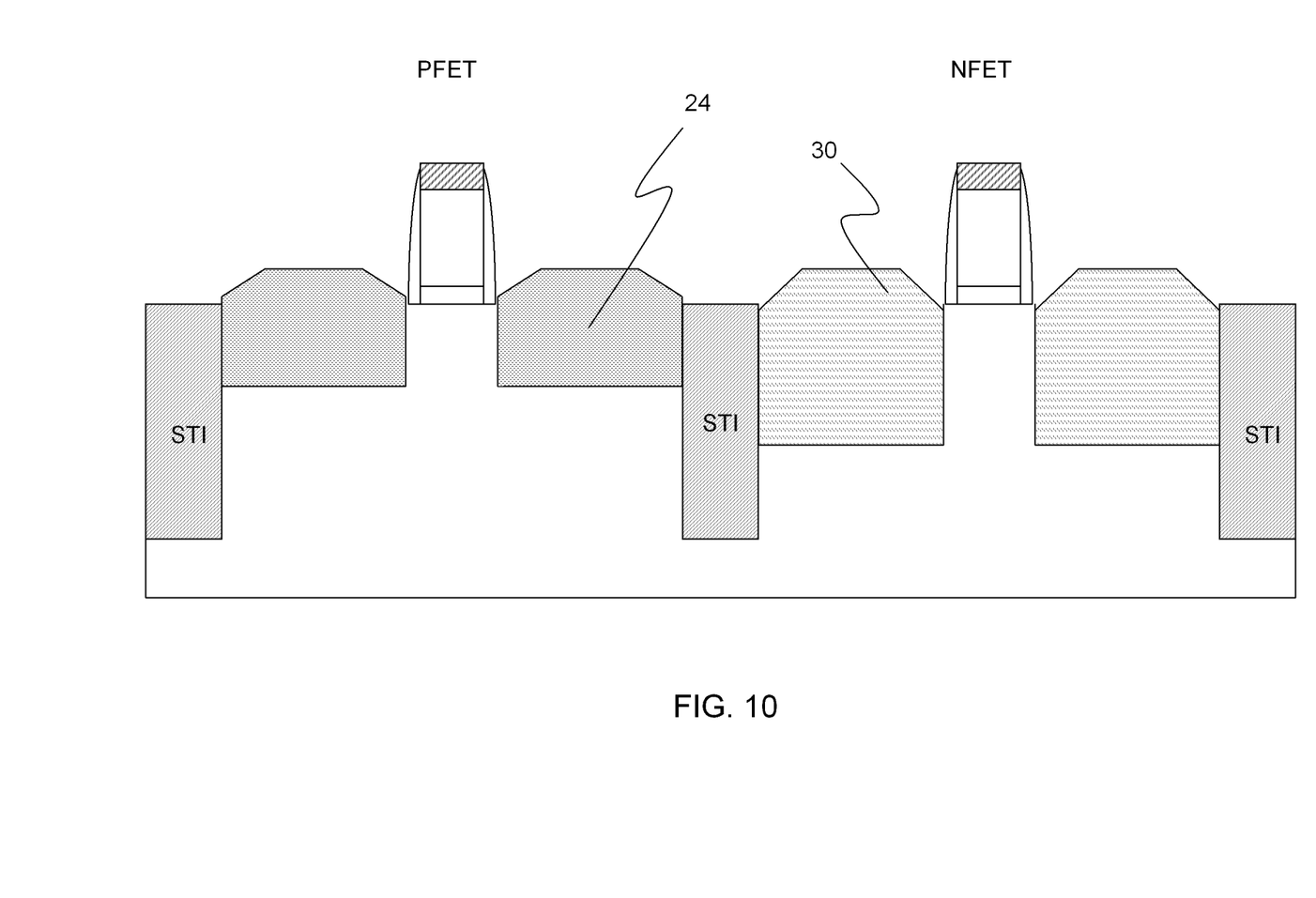
FIG. 10 shows a final structure and respective processing steps for forming an alternative strained device in accordance with different aspects of the invention.

As shown in FIG. 10, the mask 26 is removed. In the embodiment described with reference to FIGS. 8-10, the deeper recesses 28a allow more stress material 30 to be filled therein. This, in turn, provides for a greater strain concentration on the NFET, thus increasing the device performance. Also, it should be understood that the processes described with reference to FIGS. 8-10 are also applicable for a PFET, i.e., filling the recesses 22 with eSi:C material, protecting the NFET and etching the eSi:C in the recesses of the PFET and filling the formed recesses with eSiGe.

Figure 11:
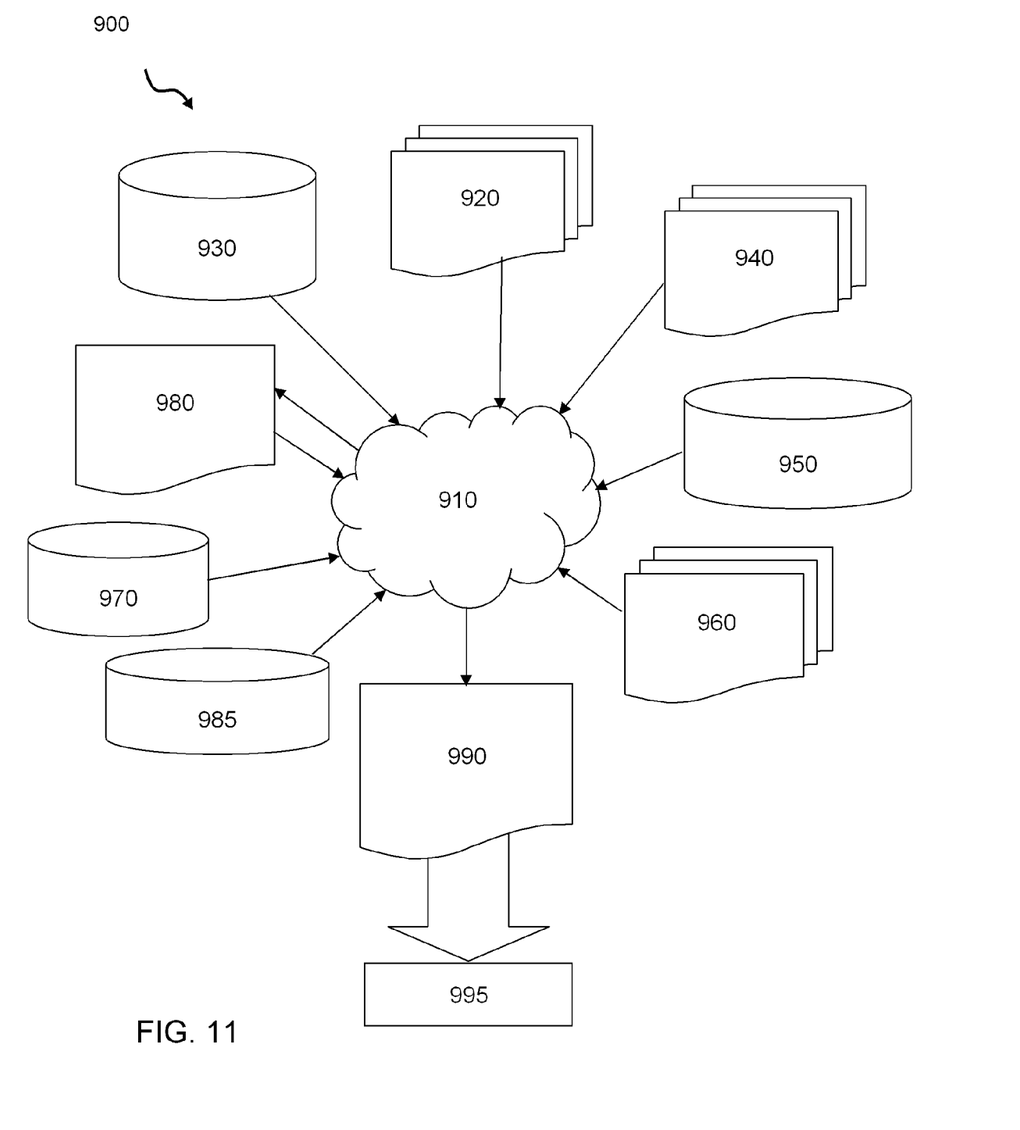
FIG. 11 shows a block diagram of an exemplary design flow used for example, in semiconductor design, manufacturing, and/or test.

FIG. 11 shows a block diagram of an exemplary design flow 900 used for example, in semiconductor design, manufacturing, and/or test. Design flow 900 may vary depending on the type of IC being designed. For example, a design flow 900 for building an application specific IC (ASIC) may differ from a design flow 900 for designing a standard component. Design structure 920 is preferably an input to a design process 910 and may come from an IP provider, a core developer, or other design company or may be generated by the operator of the design flow, or from other sources. Design structure 920 comprises an embodiment of the invention as shown in, for example, FIG. 7 or FIG. 10 in the form of schematics or HDL, a hardware-description language (e.g., Verilog, VHDL, C, etc.). Design structure 920 may be contained on one or more machine readable medium. For example, design structure 920 may be a text file or a graphical representation of an embodiment of the invention as shown in FIG. 7 or FIG. 10. Design process 910 preferably synthesizes (or translates) an embodiment of the invention as shown in FIG. 7 or FIG. 10 into a netlist 980, where netlist 980 is, for example, a list of wires, transistors, logic gates, control circuits, I/O, models, etc. that describes the connections to other elements and circuits in an integrated circuit design and recorded on at least one of machine readable medium. For example, the medium may be a CD, a compact flash, other flash memory, a packet of data to be sent via the Internet, or other networking suitable means. The synthesis may be an iterative process in which netlist 980 is resynthesized one or more times depending on design specifications and parameters for the circuit.

Design process 910 may include using a variety of inputs; for example, inputs from library elements 930 which may house a set of commonly used elements, circuits, and devices, including models, layouts, and symbolic representations, for a given manufacturing technology (e.g., different technology nodes, 32 nm, 45 nm, 90 nm, etc.), design specifications 940, characterization data 950, verification data 960, design rules 970, and test data files 985 (which may include test patterns and other testing information). Design process 910 may further include, for example, standard circuit design processes such as timing analysis, verification, design rule checking, place and route operations, etc. One of ordinary skill in the art of integrated circuit design can appreciate the extent of possible electronic design automation tools and applications used in design process 910 without deviating from the scope and spirit of the invention. The design structure of the invention is not limited to any specific design flow.

Design process 910 preferably translates an embodiment of the invention as shown in FIG. 7 or FIG. 10, along with any additional integrated circuit design or data (if applicable), into a second design structure 990. Design structure 990 resides on a storage medium in a data format used for the exchange of layout data of integrated circuits and/or symbolic data format (e.g. information stored in a GDSII (GDS2), GL1, OASIS, map files, or any other suitable format for storing such design structures). Design structure 990 may comprise information such as, for example, symbolic data, map files, test data files, design content files, manufacturing data, layout parameters, wires, levels of metal, vias, shapes, data for routing through the manufacturing line, and any other data required by a semiconductor manufacturer to produce an embodiment of the invention as shown in FIG. 7 or FIG. 10. Design structure 990 may then proceed to a stage 995 where, for example, design structure 990: proceeds to tape-out, is released to manufacturing, is released to a mask house, is sent to another design house, is sent back to the customer.

The methods as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While the invention has been described in terms of embodiments, those of skill in the art will recognize that the invention can be practiced with modifications and in the spirit and scope of the appended claims.

What is claimed:

1. A structure comprising:
gate structures for an NFET and a PFET formed on a top surface of a wafer and having identically formed sidewalls on sides of the NFET and the PFET; and
stress materials in recesses in source and drain regions of the NFET and the PFET,
wherein:
the stress materials in the recesses in the source and drain regions of the NFET and the PFET are raised to a same height above the top surface of the wafer; and
the source and drain regions of the NFET and the PFET have a different amount of stress material due to a different depth of the recesses.

2. The structure of claim 1, wherein the stress material for the NFET is eSi:C and the stress material for the PFET is eSiGe, wherein the stress material for the NFET is at a depth greater than the stress material for the PFET.

3. The structure of claim 1, wherein the stress material for the NFET is different than the stress material for the PFET.

4. The structure of claim 3, wherein the stress material for the NFET is at a depth greater than the stress material for the PFET.

5. The structure of claim 4, wherein the stress materials are epitaxially grown stress materials.

6. The structure of claim 1, wherein the recesses of the NFET are deeper than the recesses of the PFET.

7. The structure of claim 1, wherein the recesses of the PFET are deeper than the recesses of the NFET.

8. The structure of claim 1, wherein:
the stress material for the PFET is eSiGe; and
the stress material for the NFET is eSi:C.

9. The structure of claim 8, wherein:
an atomic concentration of germanium in the eSiGe ranges from about 1% to 50%; and
an atomic concentration of carbon in the eSi:C may range from about 0.1% to 10%.

10. The structure of claim 9, wherein:
the atomic concentration of germanium in the eSiGe ranges about 20% to 40%; and
the atomic concentration of the carbon in the eSi:C ranges from about 1% to 2%.

11. The structure of claim 1, wherein:
the stress materials are epitaxially grown stress materials comprising eSi:C for the NFET and eSiGe for the PFET;
the stress material for the NFET is at a depth greater than the stress material for the PFET;
the depths of the NFET and the PFET range from about 300 Å to 500 Å;
an atomic concentration of germanium in the eSiGe ranges about 20% to 40%; and
an atomic concentration of the carbon in the eSi:C ranges from about 1% to 2%.

12. The structure of claim 1, wherein the identically formed sidewalls are tapered sidewall spacers of same material, dimensions, and fabrication.

13. The structure of claim 1, wherein the stress materials in the recesses in the source and drain regions of the NFET and the PFET are both epitaxially grown above the surface of the wafer.

14. The structure of claim 1, wherein the stress material in the source and drain region of the NFET is thicker in the depth direction than the source and drain region for the PFET.

15. The structure of claim 14, wherein:
the stress materials are epitaxially grown stress materials comprising eSi:C in the source and drain region of the NFET and eSiGe in the source and drain region of the PFET; and
an amount the eSiGe is greater than an amount of the eSi:C.

16. The structure of claim 1, wherein the wafer comprises at least one shallow trench isolation (STI) structure formed between the NFET and PFET, wherein:
the recesses are within the wafer;
the stress materials completely fill the recesses;
the stress materials comprise eSi:C in the source and drain regions of the NFET and eSiGe in the source and drain regions of the PFET;
the stress materials are raised to a same height above the top surface of the wafer and the at least one STI structure such that upper surfaces of the stress materials are co-planar;
bottom surfaces of the stress materials in the source and drain regions of the NFET are at a greater depth in the wafer than bottom surfaces of the stress materials in the source and drain regions of the PFET such that an amount of the eSiC is greater than an amount of the eSi:Ge;
the bottom surfaces of the stress materials in the source and drain regions of the NFET are co-planar; and
the bottom surfaces of the stress materials in the source and drain regions of the PFET are co-planar.

17. A structure comprising:
gate structures for an NFET and a PFET;
identical tapered sidewall spacers of same material, dimensions, and fabrication on sides of the NFET and the PFET; and
stress materials in recesses in source and drain regions of the NFET and the PFET,
wherein:
the source and drain regions of the NFET and the PFET have a different amount of stress material due to a different depth of the recesses in combination with an upper surface of the stress materials of the NFET and the PFET are co-planar and above a top surface of a wafer.

18. The structure of claim 17, wherein the stress materials in the recesses in the source and drain regions of the NFET and the PFET are both epitaxially grown above the surface of the wafer.

19. The structure of claim 18, wherein:
the stress materials are epitaxially grown stress materials comprising eSi:C in the source and drain region of the NFET and eSiGe in the source and drain region of the PFET; and
an amount the eSiGe is greater than an amount of the eSi:C.

20. The structure of claim 17, further comprising a wafer comprising at least one shallow trench isolation (STI) structure formed between the gate structures for the NFET and PFET, wherein:
the recesses are within the wafer;
the stress materials completely fill the recesses;
the stress materials create a tensile strain applied to the NFET and a compressive strain applied to the PFET;
the stress materials comprise eSi:C in the source and drain regions of the NFET and eSiGe in the source and drain regions of the PFET;
the stress materials are raised to a same height above a top surface of the wafer; and
bottom surfaces of the stress materials in the source and drain regions of the NFET are at a greater depth in the wafer than bottom surfaces of the stress materials in the source and drain regions of the PFET such that an amount of the eSiC is greater than an amount of the eSi:Ge.

* * * * *